United States Patent [19]

Williams

[11] 4,370,616
[45] Jan. 25, 1983

[54] LOW IMPEDANCE ELECTROSTATIC DETECTOR

[76] Inventor: Bruce T. Williams, 86 Park Lane Cir., Lockport, N.Y. 14094

[21] Appl. No.: 178,387

[22] Filed: Aug. 15, 1980

[51] Int. Cl.³ .............................................. G01R 5/28
[52] U.S. Cl. .................................... 324/458; 324/72; 324/457
[58] Field of Search ................. 324/123 R, 457, 458, 324/72

[56] References Cited

U.S. PATENT DOCUMENTS

| | | | |
|---|---|---|---|
| 3,667,036 | 5/1972 | Searchman | 324/457 |
| 3,852,667 | 12/1974 | Williams et al. | 324/72 |
| 4,147,981 | 4/1979 | Williams | 324/32 |
| 4,205,267 | 5/1980 | Williams | 324/458 |
| 4,270,090 | 5/1981 | Williams | 324/457 |

*Primary Examiner*—Michael J. Tokar
*Attorney, Agent, or Firm*—Christel, Bean & Linihan

[57] ABSTRACT

An electrostatic detector comprising a detector electrode sensitive to electrostatic quantities such as fields, voltages, charges and the like, means for varying the capacitive coupling between the electrode and an electrostatic quantity to which the electrode is exposed, and an operational amplifier having an output and a pair of inputs, one of which is operatively associated with the amplifier summing node. A resistive feedback path is defined between the amplifier output and the summing node, the detector electrode is connected to the one amplifier input so that the detector electrode is operated directly into the amplifier summing node, and the other amplifier input is connected to an electrical reference, such as ground. As a result, the detector electrode is held at virtual ground and the amplifier is operated as a current to voltage converter to cause an output voltage to be generated equal to the product of the input current and the resistance of the feedback path. The detector can be employed in a non-contacting electrostatic voltmeter for making surface voltage measurements and which employs any one of several capacitance modulation schemes.

12 Claims, 7 Drawing Figures

LOW IMPEDANCE ELECTROSTATIC DETECTOR

BACKGROUND OF THE INVENTION

This invention relates to the electrical measurement art, and more particularly to a new and improved apparatus for detection and measurement of electrostatic quantities such as electrostatic fields, electrostatic voltages or electrostatic charges.

One area of use of the present invention is in non-contacting electrostatic voltmeters, although the principles of the present invention can be variously applied. Prior art techniques using an electrostatic modulator, a sensitive electrode detector surface, and an ultra high impedance preamplifier together with associated circuitry have been employed to produce non-contacting electrostatic instruments and systems such as electrostatic voltmeters, fieldmeters, coulometers, and charge control systems. Instruments using these prior art techniques suffer from major disadvantages particularly when removed from the laboratory environment and used in production or field applications. In addition, for production applications, where increased speed of response of the electrostatic instrument is desired, together with low cost and high reliability, instruments using the prior art techniques are not effective. In a hostile environment such as where the relative humidity is above 85% and contaminates such as dust, gases, and chemicals are present in the air, most prior art electrostatic instruments cannot operate effectively, and those that do require the use of extensive, high-cost driven shield guarding systems at the detector, electrostatic probe purging systems, and other local environment control in the detector area. In addition, to decrease the acquisition time of production line data, increased electrostatic instrument bandwidth is required. However, prior art techniques cannot deliver higher bandwidths without trading off decreased accuracy, increased noise, and further degradation of instrument performance due to environmental conditions.

It would, therefore, be highly desirable to provide an electrostatic detector which eliminates the foregoing disadvantages of prior art apparatus and which is superior in performance because of non-susceptibility to moisture, dust, chemicals, and other contamination, because of high reliability due to low electrical power consumption and low component count, because of non-critical construction features due to the elimination of driven shields and bootstrapping systems at the detector, because of capability of operation at higher modulation frequencies without performance degradation in other performance areas, and because of high temperature stability performance.

SUMMARY OF THE INVENTION

It is, therefore, a primary object of the present invention to provide a new and improved electrostatic detector.

It is a further object of this invention to provide such a detector which is unaffected by even very low shunt resistive paths across the detector.

It is a further object of this invention to provide such a detector wherein the voltage is not changed by leakage currents from the detector circuit.

It is a further object of this invention to provide such a detector which does not require a driven shield and in which microphonics are eliminated.

It is a further object of this invention to provide such a detector which does not require tradeoff of detector performance when increased bandwidth is needed.

The present invention provides an electrostatic detector comprising a detector electrode sensitive to electrostatic quantities such as electrostatic fields, voltages, charges and the like, means for varying the capacitive coupling between the electrode and an electrostatic quantity to which the electrode is exposed, and an operational amplifier having an output and a pair of inputs, one of which is operatively associated with the amplifier summing node. A feedback path having impedance is defined between the amplifier output and summing node, the detector electrode is connected to the one amplifier input so that the detector is operated directly into the amplifier summing node, and the other amplifier input is connected to an electrical reference, such as ground. As a result, the detector is held at virtual ground and the amplifier is operated as a current to voltage converter to cause an output voltage to be generated equal to the product of the input current and the impedance of the feedback path, the impedance being resistive. The detector can be employed in a non-contacting electrostatic voltmeter.

The foregoing and additional advantages and characterizing features of the present invention will become clearly apparent upon a reading of the ensuing detailed description together with the included drawing wherein:

BRIEF DESCRIPTION OF THE DRAWING FIGURES

DETAILED DESCRIPTION OF THE ILLUSTRATED EMBODIMENT

In a basic electrostatic measuring device, an electrostatic detector, which is typically a circular disc electrode surface, is coupled capacitively to an unknown electrostatic field or to a surface of unknown potential to be measured. The capacitive coupling relationship is then varied or modulated to produce an AC detector signal having an amplitude indicative of the magnitude of the unknown measured quantity while the phase of the detector signal, relative to the modulator drive signal, is either 0° or 180° depending upon the polarity of the measured unknown relative to the detector reference voltage. Various capacitor modulation techniques have been employed which include chopper types which cyclically position a shielding electrode between the detector electrode and the measured unknown. These shielding electrodes take the form of slotted or apertured discs, tuning forks vanes, or resonate cantilever beams. Another popular modulator type is the vibrating capacitor type which causes the detector surface to vibrate and therefore vary or modulate the capacitive coupling relationship of the detector to the measured unknown.

The signal thus produced by the modulation process is then coupled into the input of a very high input impedance amplifier. This amplifier is designed typically to have an input resistance of $10^{14}$ ohms, input capacitance of $10^{-14}$ farads, voltage gain of nearly unity (typically 0.9999), and a low output impedance. The output of the amplifier is then used to drive shielding surfaces placed around the detector electrode and amplifier input to further reduce amplifier or stray loading on the detector electrode. These "driven shield" techniques are well known and employed by all well-designed detector systems of current art. In addition, any practical detector circuit employs some kind of voltage surge protection system to protect against overvoltages damaging the amplifier. These protection circuits include very low leakage, low capacitance diodes which are in turn bootstrapped to the driven shield system so their shunting effect on the detector electrode is avoided until a voltage level beyond the normal range of detector voltage is encountered when they then conduct to limit destructive voltages.

Figure 1:
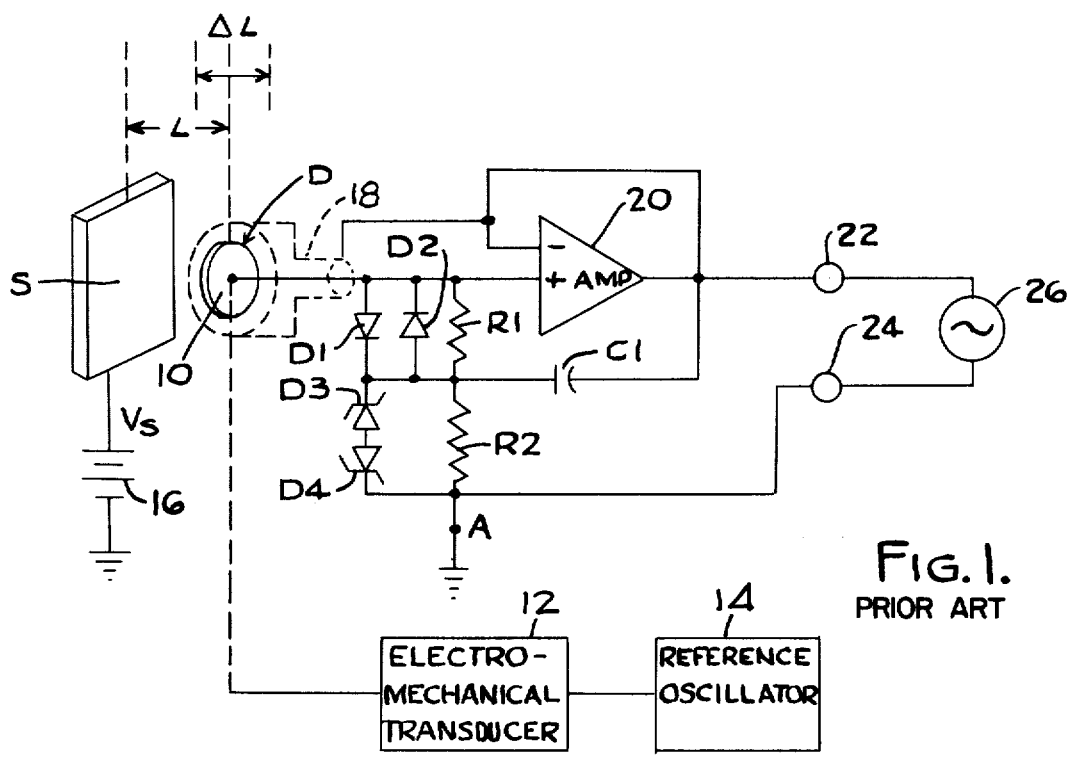
FIG. 1 is a schematic diagram of a prior art electrostatic detector and amplifier circuit.

FIG. 1 shows a typical prior art detector and amplifier circuit wherein the detector electrode D, typically a circular disc 10, is positioned a distance L from a surface S, here a plate, bearing a voltage Vs to be measured. An electromechanical transducer 12 driven by an oscillator 14 causes electrode D to oscillate and produce a mechanical displacement $\Delta L$ at the oscillator frequency M relative to the surface S. Battery 16 represents the voltage $V_S$ applied to the test surface as the unknown to be measured. A driven shield 18 for the detector is connected to the negative input terminal of an operational amplifier 20, the positive terminal of which is connected to detector D. A biasing network includes the series combination of resistors R1 and R2 connected between the amplifier positive input terminal and a reference point A connected to electrical ground. The parallel combination of reverse-poled protective diodes D1 and D2 is connected across resistor R1, and the series combination of back-to-back Zener diodes D3 and D4 is connected across resistor R2. A feedback capacitor C1 is connected between the amplifier output terminal and the junction of resistors R1,R2. The amplifier output terminal also is connected directly to the amplifier negative input terminal. The circuit includes a first output terminal 22 connected to the output terminal of amplifier 20 and a second output terminal 24 connected to the reference point A. The generated output voltage appears across terminals 22,24 which are shown connected to a utilization or measuring device 26. In the circuit of FIG. 1 the electrode D reference potential is connected to point A which in the circuit shown is returned to ground.

The disc defining the detector electrode and the plate defining the test surface form a parallel plate air capacitor system. As conventionally known, the voltage V across the plates of a capacitor C is expressed by:

$V = (L \times Q/A)$ where V is the capacitor voltage, L is the plate separation distance, Q is the charge stored in the air dielectric of the capacitor, and A is the area of the electrode disc D, which is coupled to the test surface S. In a typical application C is approximately 1 to 2 picofarads ($1.0 \times 10^{-12}$ farads), A is approximately 0.25 cm, L is approximately 1 cm and $\Delta L$ is approximately 0.1 cm peak to peak. The time constant T of the detector circuit is equal to the product of the absolute capacitance to ground of the detector electrode (approx. 1 pf.), and the shunt resistance to ground across the detector as shown by T=Rc. It is the objective of all prior art detector shunt circuits to keep the circuit time constant T much longer than the period of oscillation of the electrode excitation frequency period $P_T$. If $P_T$ is much less than T ($P_T < 0.01T$) then the charge Q on the electrode capacitance cannot change appreciably over the excitation period $P_T$. Assuming an excitation frequency of 333 HZ and the $P_T$ term is equal to 3 MS which ditates T=300 ms. The minimum shunt resistace is then $$R = \frac{T}{C} = \frac{300 \times 10^{-3} \text{ seconds}}{1 \times 10^{-12} \text{ farads}} =$$

$$300 \times 10^9 \text{ ohm} = 0.3 \times 10^{12} \text{ ohms}.$$

To achieve this very high impedance level, special protective diodes, circuit guarding, and driven shields must be employed, thus requiring high cost components and high cost production techniques. If the shunt resistance presented to the detector electrode by amplifier 20, protective diodes D1, D2, biasing network R1 and R2 and stray leakages is very high, the time constant T of the detector circuit will be long.

Once high shunt resistance is achieved thereby holding Q constant over a vibration cycle of the detector electrode D, the voltage generated on the electrode can be defined using the capacitor voltage relationship $V = (L \times Q/A)$ where Q, A are constant. The capacitor voltage V is proportional to the distance L between the plates, and a displacement of the detector electrode D results in a change in the distance by an amount $\Delta L$ resulting in a voltage change across the capacitor of $\Delta V$ defined by the relationship $(\Delta V/Vs) = (\Delta L/L)$. In the example of FIG. 1, there is a $\Delta V$ generated of 0.1 cm/1 cm (10 volts)=1 volt peak-to-peak assuming Vs is 10 volts. The voltage appearing at the output of amplifier 20, assuming a gain of one, will be one volt peak-to-peak, thus yielding a proportional percentage change in voltage V, i.e. $\Delta V/V$, for a given percentage change in displacement L, i.e. $\Delta L/L$. The gain of this circuit can be found from the expression $$V_c = \frac{(\Delta L)}{L} V_s$$

where $\Delta L/L$ is the gain term. It is noted that the gain is only a function of $\Delta L/L$ or the excursion distance and not dependent on the rate of distance change $$\frac{(dL)}{dt}$$

with time.

It is well known that to increase the bandwidth in a system to which the detector of FIG. 1 is connected, it is necessary to increase the vibrating frequency of the detector electrode D. In any practical system where the electrode and driving mechanics have finite mass, an increase of frequency will result in decreased excursion distance (without increasing the driving power to the electro-mechanical transducer 12). This occurs because at increasing frequencies, increasing forces are required to accelerate and deceleate the mass of the electrode D. This results in decreasing excursion distance and therefor decreased gain ΔL/L at high frequencies.

Thus a major disadvantage of the foregoing prior art detector is that at higher bandwidths decreased gain is evidenced which results in higher system noise and lower system accuracy. Another disadvantage is the requirement to maintain a shunt resistance of a very high value, i.e. $0.3 \times 10^{12}$ ohms, in the presence of high humidity and contamination. A further disadvantage is evident at high detector circuit operating temperature. At high temperature any electrode monitoring amplifier, such as amplifier 20 in the circuit of FIG. 1, will leak bias current, i.e., offset current, into the R1, R2 biasing network thus producing an offset voltage at the detector equal to V offset = i offset (R1+R2). This offset voltage appears as a zero shift in the system by creating a non-zero voltage level on the detector electrode even at Vs=0, thus creating system errors. Very high cost amplifiers or D.C. decoupling of the detector from the amplifier is required to alleviate this problem.

Figure 2:
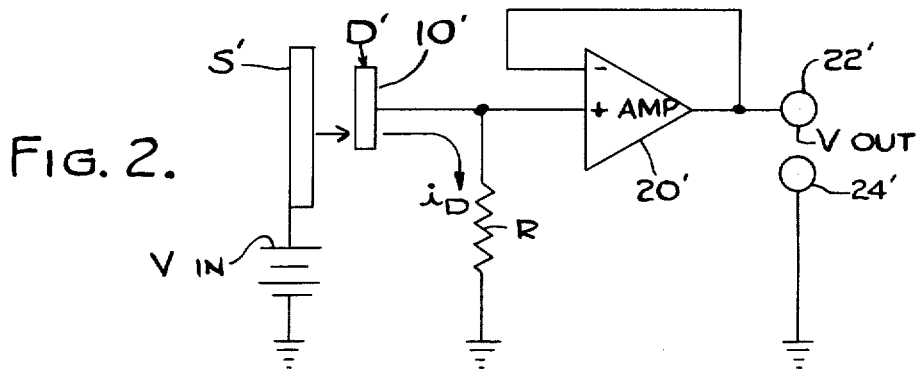
FIG. 2 is a simplified schematic diagram of the detector of FIG. 1.

FIG. 2 is a simplified schematic representation of the detector of FIG. 1 and includes detector D' in the form of a disc 10', test surface S', unknown voltage V in, amplifier 20' and output terminals 22',24'. An oscillator-transducer combination (not shown) is operatively connected to detector D' in a manner similar to that of FIG. 1. The amplifier output is connected to output terminal 22' and also fed back to the negative input terminal of the amplifier. Output terminal 24' is connected to ground. Detector D' is connected to the positive input terminal of amplifier 20'. The resistor R connected between the amplifier positive input terminal and ground represents the effective shunt resistance of the detector. The displacement current $i_D$ is shown flowing from detector D' through resistance R.

A mathematical model of the systems of FIGS. 1 and 2 is V out = $i_D$R where $i_D$ is the displacement current dQ/dt, and R is the effective shunt resistance of the detector and Vout is the voltage across output terminals 22',24'. The dQ/dt term or displacement current $i_D$ is developed from the equation Q=CV. Because C, the detector capacitance, and V, the capacitor voltage, are both changing with time, the total equation is differentiated with respect to time to obtain (dQ/dt)=(cdv/dt)+(Vdc/dt) which is the full system equation, where dQ/dt is the displacement current $i_D$, which has a very small, non-zero value. The quantity CdV/dt is a current equal to the capacitance of the detector times the rate change of capacitor voltage V. The quantity Vdc/dt is a current equal to the steady state capacitor voltage ($V_s$) times the rate change of capacitance C.

In the prior art detector, R is made high enough to validate the assumption that dQ/dt and therefore $i_D$ is zero. In analyzing the cdv/dt term, C is equal to approximately 1 pf as before and dv/dt is equal to the differential of V. V=$V_{out}$=0.3 sin Wt where sin Wt=sin 2072t=the excursion frequency. Thus, dV/dt=(0.3)(2072)(cos Wt)=620 cos Wt, and by choosing cos Wt=max at t=0 the result is a cdv/dt of $1 \times 10^{-12} \times 620 = 620$ picoamp. In analyzing the Vdc/dt term which would appear to be equal to but opposite in polarity to the cdv/dt term in order to make the sum $i_D$ near zero, V=10 volts, C=0.1 pf peak to peak, 0.1 pf peak to peak is equal to 0.03 pf rms, C=(0.03) (sin Wt), dc/dt=(0.03) (2072) cos Wt, dc/dt=62 at t=0, and therefore V dc/dt=(10)(62)=620 picoamp. Therefore, to hold Q nearly constant and dQ/dt nearly zero the two current terms cdv/dt and vdc/dt are nearly equal and of opposite sign. The sign can be assigned at T=0 where the electrode D or D' is moving toward the surface thereby causing C to increase while simultaneously V is decreasing, or the sign can be assigned at any other time where Vα1/C. Therefore, any increasing V is produced by decreasing C and conversely.

Figure 3:
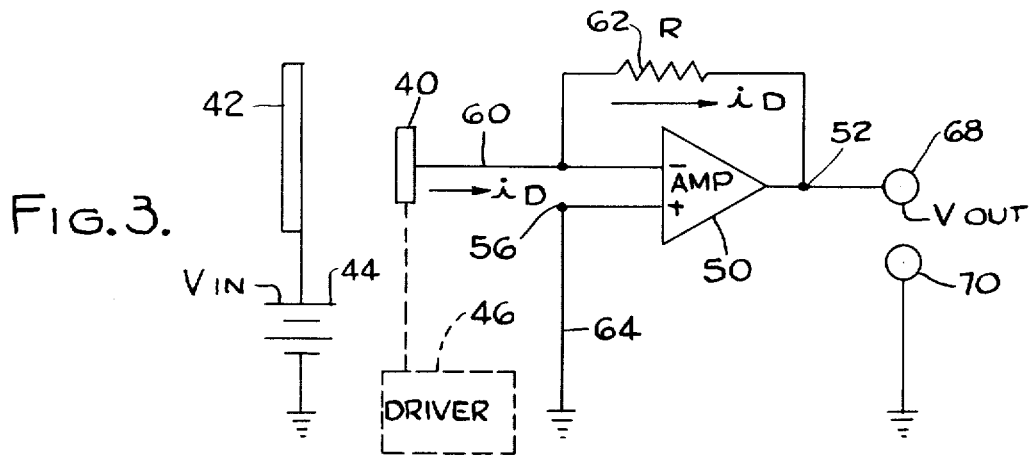
FIG. 3 is a schematic diagram of an electrostatic detector according to the present invention.

FIG. 3 illustrates a non-contacting electrostatic detector according to the present invention which comprises a detector electrode 40 which is sensitive to electrostatic quantities such as electrostatic fields, voltages, charges and the like. Electrode 40 is of electrically conducting material, preferably metal. During use, detector 40 is placed in spaced, non-contacting relationship to a test surface 42 bearing a potential to be detected and measured. A battery 44 connected to surface 42 represents the unknown voltage Vin on surface 40. The detector further comprises means for varying the capacitive coupling between electrode 40 and the electrostatic quantity to which the electrode is exposed, for example the potential V in on surface 42. In the detector shown, a driver 46 is operatively connected to electrode 40, driver 46 including the combination of an oscillator and electromechanical transducer as in the detector of FIG. 1.

The detector according to the present invention further comprises an operational amplifier 50 having an output 52 and a pair of inputs 54,56 with the negative input 54 being connected to the summing node of the amplifier 50. In accordance with this invention there is provided means in the form of a conductor 60 for connecting detector 40 to the amplifier input 54 so that detector 40 is operated directy into the amplifier summing node. There is also provided means in the form of resistor 62 connected between input terminal 54 and output terminal 52 of amplifier 50 for defining a feedback path between the amplifier output and the amplifier summing node. The feedback path has an impedance which in the detector shown is resistive. The amplifier positive input terminal 56 is connected to an electrical reference by means of a conductor 64. In the circuit of FIG. 3 the reference is ground.

The detector according to the present invention further comprises a pair of output terminals 68,70 across which the detector output voltage, $V_{out}$, appears. Output terminal 68 is connected to amplifier output terminal 52 and output terminal 70 is connected to the electrical ground or reference.

Thus, the detector electrode 40 is operated directly into the summing node of the operational amplifier 50, When connected into this configuration the detector electrode 40 is held at virtual ground and the amplifier 50 is operated as a current to voltage converter to cause an output voltage to be generated equal to the input current times the feedback resistance values. This occurs because any displacement current generated by the detector is matched exactly by an equal current flowing through the resistance R of the feedback resistor 62, and therefore the amplifier negative input terminal 54 is held at zero volt. With this connection the effective shunt resistance of the detector is zero ohms.

The relationship Q=CV also applies to this detector, and when differentiated with respect to time this relationship becomes dQ/dt=cdv/dt+vdc/dt. The cdv/dt term is equal to zero because the detector electrode 40 is connected to a zero impedance node thereby not permitting a dv/dt to exist. The vdc/dt term is, as before, equal to 620 volt pf/sec. = 620 picoamp. This current, designated $i_D$ in FIG. 3, will not be cancelled by the cdv/dt so it will be available to flow into the summing node of amplifier 50. An equal current $i_D$ will flow through the feedback resistance R and appears as a voltage of $(620 \times 10^{-12})$ (R) volts at the amplifier output The advantages of this low impedance detector system over prior art detectors are numerous. Where prior art detectors were susceptible to very small leakages caused by moisture or contaminations shorting the high required detector shunt resistances, the detector of this invention, being already shorted to virtual ground, cannot be affected by even very low shunt resistive paths across the detector. The detector operates very efficiently with a resistive shunt as low as 20 kilohms across the detector.

Leakage currents flowing from the amplifier 50 at high temperatures cannot cause the voltage of the detector electrode 40 to change. All leakage currents associated with the amplifier 50 can be supplied through the feedback resistance R to hold the detector voltage at zero thus allowing the use of an inexpensive amplifier.

Amplifier protection against voltage surges onto the detector can easily be accomplished using ordinary low cost diodes in shunt with the detector to ground. The presence of these diodes in no way effects detector operation because for normal current levels into the detector no voltage, either steady state or dynamic, appears across the diodes. Only when current levels beyond the capability of those being supplied through the feedback resistance R are realized can the voltage level of the amplifier summing node or junction and detector rise to cause conduction of surge currents through the diodes to ground.

The use of "driven shield" techniques to reduce leakage and capacitive loading of the detector electrode 40 are unnecessary because the electrode is at a low impedance level, i.e. virtual ground. Also, microphonics, which plague prior art detectors because of their high impedance level operation, are eliminated by the low impedance detector system.

Perhaps the greatest advantage of the detector system of this invention is its ability to hold its transfer gain fairly constant as a function of the excursion frequency of the detector electrode 40. This is shown by the term Vdc/dt whereby the detector current generated is a function of the rate of capacitance change with respect to time. This is in contrast to prior art devices where the detector signal varies as a function of the magnitude of the excursion ΔL of the detector electrode. Thus when increased bandwidth is desired thereby dictating an increase of excursion frequency, a tradeoff of detector performance need not be made.

This constant gain feature is further illustrated in the situation where the excursion distance falls in half by raising the excursion frequency by two, with the result that the term dc/dt stays relatively constant and therefore keeps the gain relatively constant. It is not necessary to increase the electro-mechanical drive power to keep gain constant, in contrast to prior art devices where the ΔL/L term must be maintained to keep gain constant.

Figure 4:
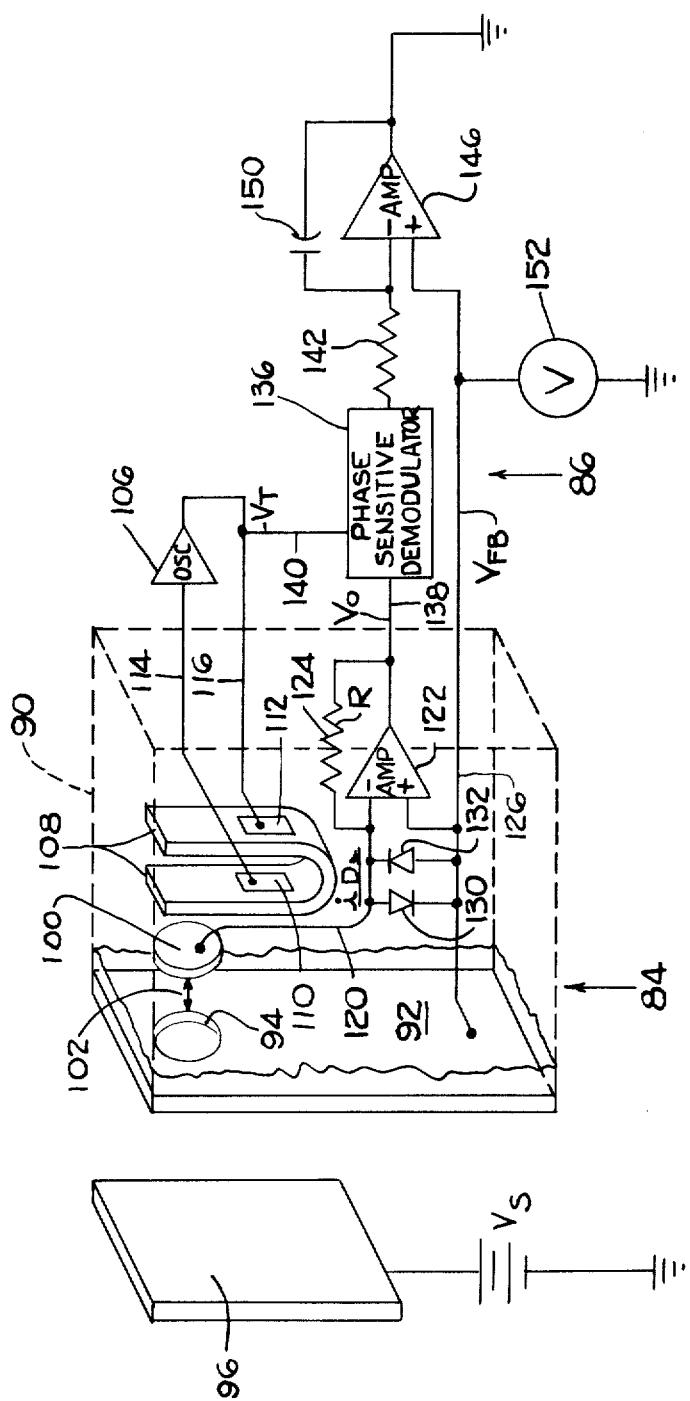
FIG. 4 is a schematic diagram showing the detector of the present invention employed in an electrostatic voltmeter of the vibrating capacitor type.
Figure 5:
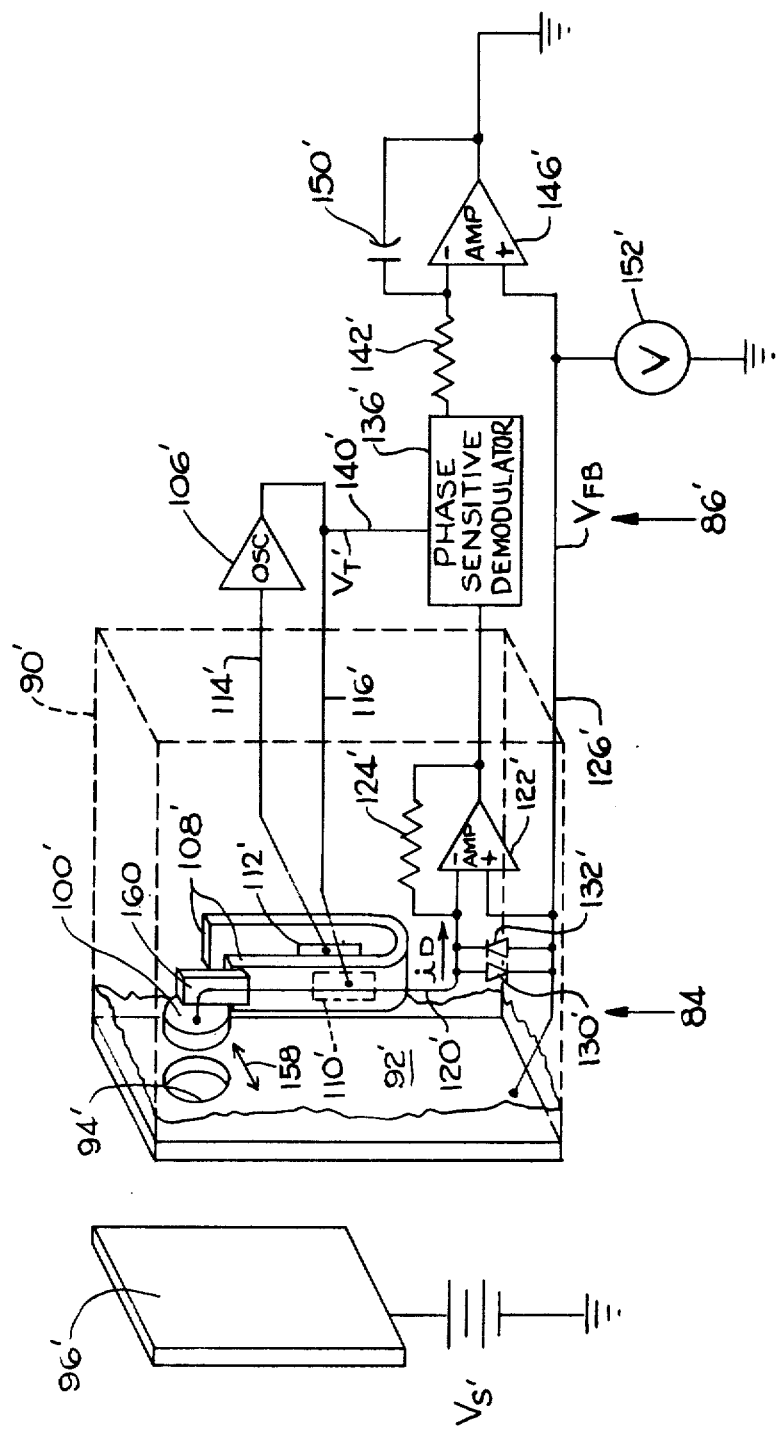
FIG. 5 is a schematic diagram showing the detector of the present invention employed in an electrostatic voltmeter of the kind having a chopper type modulator.
Figure 6:
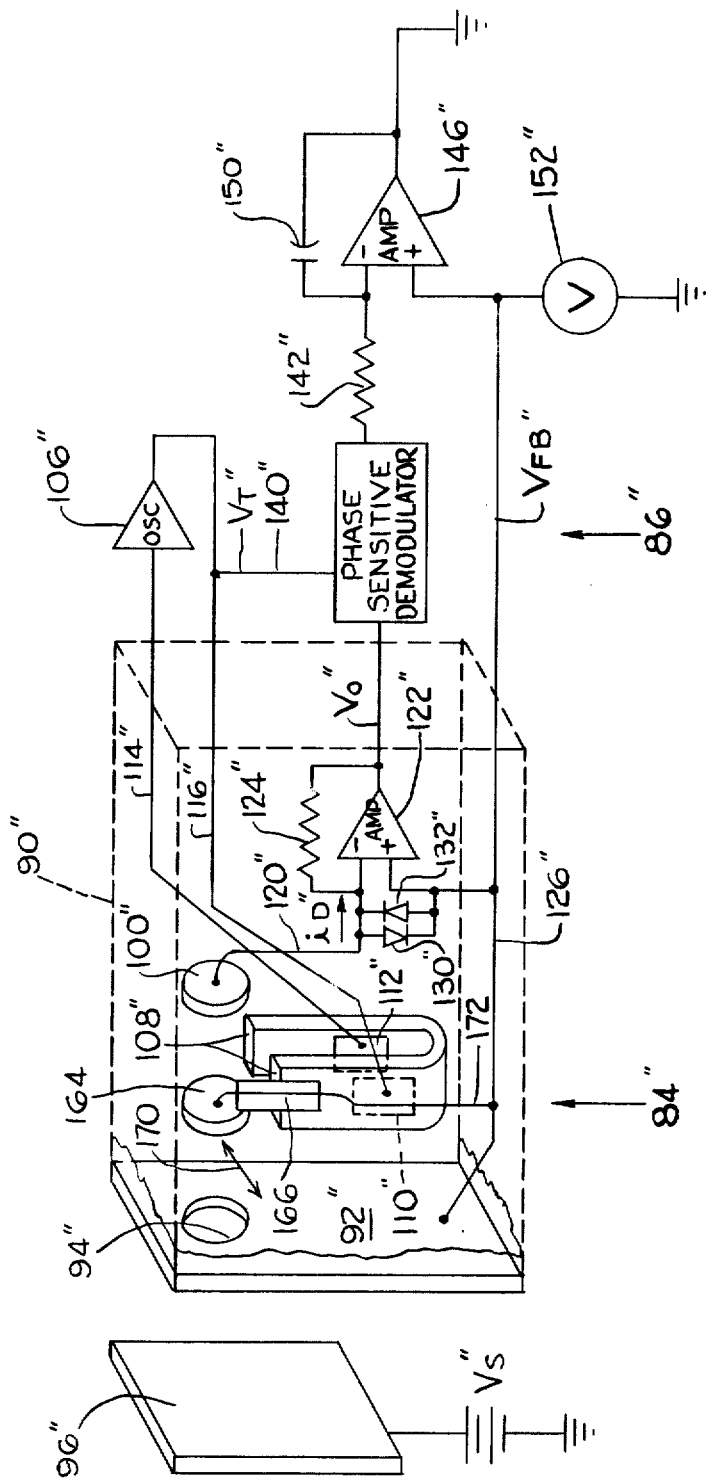
FIG. 6 is a schematic diagram showing the detector of the present invention employed in an electrostatic voltmeter of the kind having a modulator of the shielding electrode type.

The detector of this invention can be employed equally well with any of the modulation systems previously mentioned such as segmented disc choppers, tuning fork vane choppers, as well as vibrating capacitor modulations to obtain the advantages of the detector. FIGS. 4–6 illustrate the detector system of this invention used in electrostatic voltmeter apparatus to make surface voltage measurements. Referring first to FIG. 4, the detector of the present invention is included in an electrostatic voltmeter of the vibrating capacitor type such as the voltmeter disclosed in U.S. Pat. No. 4,147,981 issued Apr. 3, 1979 and entitled Electrostatic Voltmeter Probe Positioned On The Outside Of A Housing And Vibrated By A Piezoelectric Transducer Within The Housing, the disclosure of which hereby is incorporated by reference. Briefly, the voltmeter of FIG. 4 includes a probe 84 and processing circuit 86 connected by an electrical cable. Probe 84 includes a housing 90 having an operative surface 92 provided with an opening 94. Surface 92 is of electrically conductive material, preferably metal. In use, the probe 84 is positioned so that surface 92 and opening 94 are disposed toward a surface 96 bearing a voltage or potential $V_s$ to be measured. The detector electrode 100 is located within housing 90 in registry with opening 94. Electrode 100 is operatively associated with a driver means for moving electrode 100 toward and away from opening 94 in the direction of arrow 102 for varying the capacitive coupling between electrode 100 and the electrostatic quantity to which electrode 100 is exposed, i.e. the potential $V_s$ on surface 96. In the voltmeter shown in FIG. 4, the driver means comprises the combination of an oscillator 106 and an electromechanical transducer in the form of tuning fork 108 having piezoelectric elements 110, 112 attached to the tines thereof, and electrode 100 is suitably attached to the end of one tine of the tuning fork 108. Piezoelectric elements 110, 112 and oscillator 106 are connected in an electrical circuit by means of conductor 114 connecting element 110 to the input of oscillator 106 and conductor 116 connecting the oscillator output to piezoelectric element 112. For a more detailed description of the foregoing arrangement, reference may be made to the above-mentioned U.S. Pat. No. 4,147,981.

The voltmeter of FIG. 4 includes an electrostatic detector similar to that of FIG. 3. Detector electrode 100 is connected by conductor 120 to the negative input of an operational amplifier 122 so as to be operated directly into the amplifier summing node. The amplifier output is connected to the negative amplifier input terminal through a feedback resistor 124 having a magnitude of R. The amplifier positive input terminal is connected to a reference in the form of conductor 126 which is connected to probe surface 92 for supplying a feedback voltage thereto in a known manner. A pair of reverse-poled protective diodes 130, 132 are connected across conductors 120, 126.

The detector is operated at a zero impedance level to cause the V dc/dt term to generate a current, i.e. the displacement current, into the summing node of the amplifier 122 while holding the detector voltage or c dv/dt term at zero during all time of the operation of the detector. The detector generated signal Vo at the output of amplifier 122 is equal to the product of the displacement current $i_D$ and the feedback resistance R. Signal Vo is applied to one input of a phase sensitive demodulator 136 by means of a conductor 138 leading from the output of amplifier 122. A signal $V_T$ representing the detector displacement term dc/dt is applied to another input of demodulator 136 by means of a conductor 140 connecting conductor 116 to the demodulator input. The output of demodulator 136 is a d.c. signal having an amplitude proportional to the detector signal Vo and a polarity dependent upon the relative polarity between the feedback voltage $V_{FB}$ on condutor 126 and the voltage Vs on test surface 96.

The output of demodulator 136 is connected by a resistor 142 to the negative input terminal of an operational amplifier 146 which functions as a high voltage integrating amplifier. Conductor 126 on which the feedback voltage $V_{FB}$ is present is connected to the positive input of amplifier 146. The output of amplifier 146 is connected to electrical ground and through an integrating capacitor 150 to the positive amplifier input terminal. A voltmeter 152 is connected between the amplifier positive input terminal and electrical ground. Thus, the output of demodulator 136 is integrated by the high voltage integrating amplifier to change the feedback voltage $V_{FB}$ relative to ground. When feedback voltage $V_{FB}$ is exactly the same as the test surface voltage $V_S$, the detector output signal Vo goes to zero. With signal Vo at zero no further integration takes place and feedback voltage $V_{FB}$ stabilizes at the Vs voltage value. As a result, feedback voltage $V_{FB}$ can be monitored to determine the unknown surface voltage Vs.

Referring next to FIG. 5, the detector is included in an electrostatic voltmeter of the type which employs a chopper type modulator which moves the detector element relative to an aperture to cause a chopping of the coupling capacitance. The voltmeter of FIG. 5 is like that disclosed in U.S. Pat. No. 3,852,667 issued Dec. 3, 1974 and entitled Probe For Electrostatic Voltmeter, the disclosure of which is hereby incorporated by reference. In FIG. 5 components similar to those shown in FIG. 4 are identified by the same reference numerals with a prime designation. In the voltmeter of FIG. 5, electrode 100' is moved in a direction parallel to the plane of opening 94' in surface 92' in the direction of the arrow 158 to vary cyclically the amount of the surface of electrode 100' which is exposed to test surface 96' through opening 94' thereby varying the capacitive coupling between electrode 100' and the potential on test surface 96'. The foregoing is accomplished by attaching electrode 100' to one of the tines of tuning fork 108' by means of an element 160 with the electrode 100' and tuning fork 108' being disposed as shown in FIG. 5. As in the embodiment of FIG. 4 the detector is operated at a zero impedance level to cause the V dc/dt term to generate a current, i.e. the displacement current, into the summing node of the operational amplifier 122' while holding the detector voltage or C dv/dt term at zero during all time of the operation of the detector. The feedback voltage $V_{FB}$' is monitored by meter 152' to determine the unknown surface voltage Vs'.

Referring now to FIG. 6, the detector is included in an electrostatic voltmeter of the type which employs a modulator of the shielding electrode type where an electrode is cyclically moved between the detector electrode and an aperture to achieve a chopping of the coupling capacitance to the test surface. In FIG. 6 components similar to those shown in FIGS. 4 and 5 are identified by the same reference numerals with a double prime designation. In the voltmeter of FIG. 6 electrode 100" is stationary, being held within housing 90" by suitable means (not shown), is disposed in a plane parallel to the plane of opening 94"', and is located so as to be in registry with opening 94". A chopper element in the form of a metal disc 164 is located between electrode 100" and opening 94" and is attached by an element 166 to one of the tines of tuning fork 108". Disc 164 and tuning fork 108" are disposed so that disc 164 is moved in a direction parallel to opening 94" and to electrode 100" in the direction of arrow 170 in FIG. 6. As a result, the movement of disc 164 cyclically varies the capacitive coupling between electrode 100" and the potential or test surface 96". The conductive chopper disc element 164 is connected electrically by a conductor 172 to conductor 126" on which the feedback voltage $V_{FB}$" is present. As in the embodiment of FIGS. 4 and 5, the detector is operated at a zero impedance level to cause the V dc/dt term to generate a current, i.e. the displacement current, into the summing node of the operational amplifier 122" while holding the detector voltage or C dv/dt term at zero during all time of the operation of the detector. The feedback voltage $V_{FB}$" is monitored by meter 152" to determine the unknown surface voltage Vs".

Figure 7:
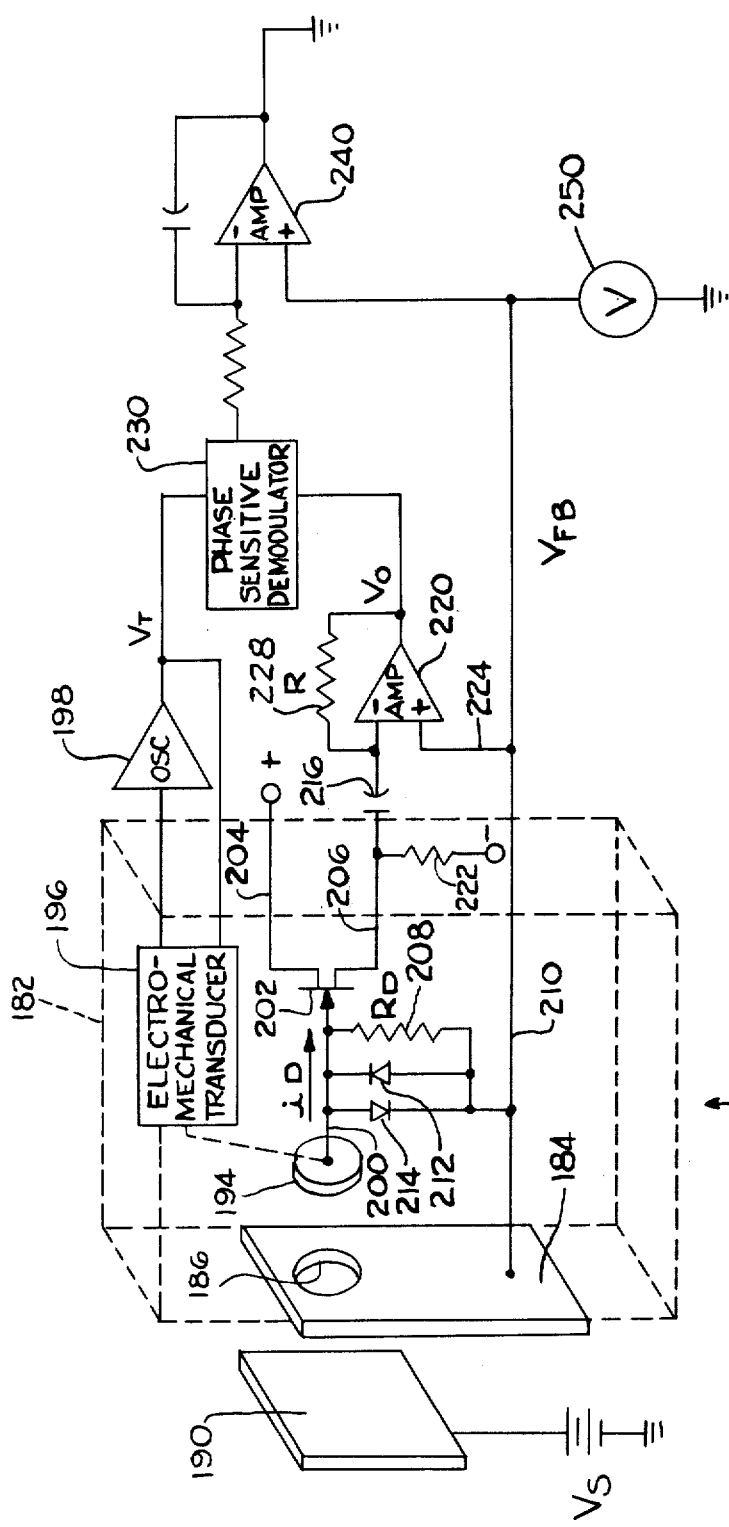
FIG. 7 is a schematic diagram of an electrostatic detector according to another embodiment of the present invention.

FIG. 7 shows an electrostatic detector according to another embodiment of the present invention employed in an electrostatic voltmeter using a low impedance shunt and preamplifier. The voltmeter of FIG. 7 includes a probe 180 having a housing 182 including an operative surface 184 provided with an opening 186 therein. Surface 184 is of electrically conductive material, preferably metal. In use, probe 180 is positioned so that surface 184 and opening 186 are disposed toward a surface 190 bearing a voltage or potential Vs to be measured. The detector electrode 194 is located within housing 182 so as to be capacitively coupled through opening 186 to the electrostatic quantity to be measured, and there is provided means for varying that capacitive coupling such as that shown in the arrangements of FIGS. 4-6. In particular, electrode 194 is operatively associated with a driver means comprising electromechanical transducer 196 and oscillator 198 for moving electrode 194 relative to opening 186 to vary the capacitive coupling between electrode 194 and the potential Vs on surface 190. The detector of FIG. 7 thus operates with any of the modulation techniques shown in FIGS. 4-6.

Detector electrode 194 is connected by conductor 200 to the input of a preamplifier in the form of a field effect transistor 202 having a gate electrode connected to conductor 200, a drain electrode connected by a conductor 204 to a source of positive bias voltage (not shown) and a source electrode connected to a conductor 206. A shunt resistor 208 having a relatively low resistance $R_D$ is connected between conductor 200 and a reference in the form of conductor 210 which is connected to probe surface 184 for supplying a feedback voltage $V_{FB}$ thereto in a known manner. A pair of reverse-poled protective diodes 212,214 are connected across conductors 200,210 to protect the preamplifier 202.

The displacement current $i_D$ flows through the relatively low resistance $R_D$ provided by shunt resistor 208, and the voltage generated across the shunt resistance is monitored by the preamplifier 202. The output of the preamplifier is a current $i_D$ flowing through conductor 206 having a magnitude equal to the product of the displacement current, the shunt resistance value and the transconductance Gm of preamplifier 202 or $$i_o = (Gm)(i_D)(R_D)$$

Conductor 206 is coupled by a capacitor 216 to the negative input terminal of an operational amplifier 220 so the operation is directly into the amplifier summing node as in the preceding embodiments. Conductor 206 also is connected through a voltage dropping resistor 222 to a source of negative bias voltage (not shown). The amplifier positive input terminal is connected by a conductor 224 to the reference provided by feedback voltage conductor 210. The amplifier output is connected by a feedback resistor 228 of magnitude R to the amplifier negative input terminal. The amplifier output voltage Vo is equal to the product of the current $i_o$ and feedback resistance R.

The provision of shunt resistor 208 and preamplifier 202 advantageously avoids the need for the relatively large operational amplifier 220 to be included in probe 180 so that the probe can be made very small in size. However, the magnitude $R_D$ of shunt resistor 208 is made so small that during operation the voltages generated on detector electrode 194 are less than 1% of those generated in prior art devices. Accordingly, the c dv/dt term can be assumed to be zero as in the preceding embodiments. The remainder of the voltmeter of FIG. 7 including phase sensitive demodulator 230, integrating amplifier 240 and meter 250 operates in the same manner as the voltmeters of the preceding embodiments.

It is therefore apparent that the present invention accomplishes its intended objects. While several embodiments of the present invention have been described in detail, this is done for the purpose of illustration, not limitation.

I claim:

1. A non-contacting electrostatic detector comprising:
   (a) a detector electrode sensitive to electrostatic quantities such as electrostatic fields, voltages, charges and the like;
   (b) means operatively associated with said electrode for varying the capacitive coupling between said electrode and an electrostatic quantity to which said electrode is exposed;
   (c) an operational amplifier having an output and a pair of inputs, one of which is operatively associated with the summing node of the amplifier;
   (d) means for defining a feedback path between said amplifier output and said amplifier summing node, said feedback path having an impedance;
   (e) means for connecting said detector electrode to said one amplifier input so that said detector is operated directly into said amplifier summing node; and
   (f) means for connecting the other of said amplifier inputs to an electrical reference;
   (g) whereby said detector is held at virtual ground and said amplifier is operated as a current to voltage converter to provide an output voltage equal to the product of the amplifier input current and the impedance of said feedback path.

2. An electrostatic detector according to claim 1, wherein said electrical reference to which said other amplifier input is connected is electrical ground.

3. An electrostatic detector according to claim 1 further including:
   (a) a housing containing said detector and thereby defining a probe;
   (b) an electrical conductor having one end connected to the output of said amplifier; and
   (c) a signal processing circuit having an input connected to the other end of said conductor for providing output information as to the magnitude and polarity of the electrostatic quantity to which said detector electrode is exposed.

4. An electrostatic detector according to claim 1 further including:
   (a) a housing containing said detector electrode and having an electrically conductive surface provided with an opening therein for exposing said detector electrode to a surface spaced from said housing surface and bearing an electrostatic quantity to be measured;
   (b) means including an electrical conductor for applying a feedback voltage to said housing surface, said other input of said amplifier being connected to said conductor; and
   (c) means for monitoring said feedback voltage to obtain information relating to said electrostatic quantity for measurement thereof.

5. A non-contacting electrostatic detector comprising:
   (a) a detector electrode sensitive to electrostatic quantities such as electrostatic fields, voltages, charges and the like;
   (b) means operatively associated with said electrode for varying the capacitive coupling between said electrode and an electrostatic quantity to which said electrode is exposed;
   (c) an operational amplifier having an output and a pair of inputs, one of which is operatively associated with the summing node of the amplifier;
   (d) means for defining a feedback path between said amplifier output and said amplifier summing node, said feedback path having an impedance;
   (e) a pre-amplifier for coupling said detector electrode to said one operational amplifier input and thereby into said operational amplifier summing node;
   (f) means for connecting the other of said operational amplifier inputs to an electrical reference;
   (g) whereby said detector is held at virtual ground and said operational amplifier is operated as a current to voltage converter to provide an output voltage equal to the product of the operational amplifier input current and the impedance of said feedback path.

6. An electrostatic detector according to claim 5, further including a relatively low magnitude shunt impedance connected between the input of said preamplifier and said electrical reference.

7. An electrostatic detector according to claims 5 or 6 further including:
   (a) a housing containing said detector electrode and preamplifier thereby defining a probe;
   (b) a signal processing circuit having an input connected to the output of said operational amplifier for providing output information as to the magnitude and polarity of the electrostatic quantity to which said detector is exposed, and
   (c) an electrical conductor having one end connected to the output of said preamplifier and the other end connected to said one operational amplifier input whereby the probe can be located physically spaced from the remainder of the apparatus.

8. An electrostatic detector according to claims 5 or 6 further including:

(a) a housing containing said detector electrode and preamplifier and having an electrically conductive surface provided with an opening therein for exposing said detector electrode to a surface spaced from said housing surface and bearing an electrostatic quantity to be measured;

(b) means including an electrical conductor for applying a feedback voltage to said housing surface, said other input of said operational amplifier being connected to said conductor; and (c) means for monitoring said feedback voltage to obtain information relating to said electrostatic quantity for measurement thereof.

9. An electrostatic detector according to claims 1 or 5, wherein said feedback path is resistive.

10. A non-contacting electrostatic detector comprising:

(a) a detector electrode sensitive to electrostatic quantities such as electrostatic fields, voltages, charges and the like;

(b) means operatively associated with said electrode for varying the capacitive coupling between said electrode and an electrostatic quantity to which said electrode is exposed;

(c) an operational amplifier having an output and a pair of inputs, one of which is operatively associated with the summing node of the amplifier;

(d) means for defining a feedback path between said amplifier output and said amplifier summing node, said feedback path having an impedance;

(e) means for connecting said detector electrode to said one amplifier input so that said detector is operated directly into said amplifier summing node;

(f) means for connecting the other of said amplifier inputs to an electrical reference;

(g) whereby said detector is held at virtual ground and said amplifier is operated as a current to voltage converter to provide an output voltage equal to the product of the amplifier input current and the impedance of said feedback path;

(h) a housing containing said detector electrode having an electrically conductive surface provided with an opening therein for exposing said detector electrode to a surface spaced from said housing surface and bearing an electrostatic quantity to be measured;

(i) a phase sensitive demodulator having an output, one input connected to said capacitive coupling varying means and another input connected to the output of said operational amplifier;

(j) a high voltage integrating amplifier having an output connected to electrical ground and a pair of inputs, one of which is connected to the output of said demodulator;

(k) means connecting the other input of said integrating amplifier to said housing surface for applying a feedback voltage to said housing surface;

(l) means for connecting the other input of said operational amplifier to said feedback voltage applying means; and (m) voltage magnitude indicating means connected to said feedback voltage applying means;

(n) whereby the output of said demodulator is a d.c. signal having an amplitude proportional to the detector signal output of said operational amplifier and having a polarity dependent upon the relative polarity between the feedback voltage and the polarity of the electrostatic quantity to be measured and said integrating amplifier changes the feedback voltage relative to ground so that when the feedback voltage reaches the same magnitude as the electrostatic quantity to be measured the detector signal output of said operational amplifier goes to zero so that the feedback voltage stabilizes at the value of the electrostatic voltage and can be monitored to measure the electrostatic voltage.

11. A non-contacting electrostatic detector comprising:

(a) a detector electrode sensitive to electrostatic quantities such as electrostatic fields, voltages, charges and the like;

(b) means operatively associated with said electrode for varying the capacitive coupling between said electrode and an electrostatic quantity to which said electrode is exposed;

(c) an operational amplifier having an output and a pair of inputs, one of which is operatively associated with the summing node of the amplifier;

(d) means for defining a feedback path between said amplifier output and said amplifier summing node, said feedback path having an impedance;

(e) a pre-amplifier for coupling said detector electrode to said one operational amplifier input and thereby into said operational amplifier summing node;

(f) means for connecting the other of said operational amplifier inputs to an electrical reference;

(g) whereby said detector is held at virtual ground and said operational amplifier is operated as a current to voltage converter to provide an output voltage equal to the product of the operational amplifier input current and the impedance of said feedback path;

(h) a housing containing said detector electrode and preamplifier and having an electrically conductive surface provided with an opening therein for exposing said detector electrode to a surface spaced from said housing surface and bearing an electrostatic quantity to be measured;

(i) a phase sensitive demodulator having an output, one input connected to said capacitive coupling varying means and another input connected to the output of said operational amplifier;

(j) a high voltage integrating amplifier having an output connected to electrical ground and a pair of inputs, one of which is connected to the output of said demodulator;

(k) means connecting the other input of said integrating amplifier to said housing surface for applying a feedback voltage to said housing surface;

(l) means for connecting the other input of said operational amplifier to said feedback voltage applying means; and (m) voltage magnitude indicating means connected to said feedback voltage applying means;

(n) whereby the output of said demodulator is a d.c. signal having an amplitude proportional to the detector signal output of said operational amplifier and having a polarity dependent upon the relative polarity between the feedback voltage and the polarity of the electrostatic quantity to be measured and said integrating amplifier changes the feedback voltage relative to ground so that when the feedback voltage reaches the same magnitude as the electrostatic quantity to be measured the detector signal output of said operational amplifier goes to zero so that the feedback voltage stabilizes at the value of the electrostatic voltage and can be monitored to measure the electrostatic voltage.

12. An electrostatic detector according to claim 11, further including a relatively low magnitude shunt impedance connected between the input of said preamplifier and said electrical reference.

* * * * *